(12) United States Patent
Faguet

(10) Patent No.: US 7,485,338 B2
(45) Date of Patent: Feb. 3, 2009

(54) METHOD FOR PRECURSOR DELIVERY

(75) Inventor: Jacques Faguet, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 422 days.

(21) Appl. No.: 11/095,626

(22) Filed: Mar. 31, 2005

(65) Prior Publication Data

US 2006/0222768 A1     Oct. 5, 2006

(51) Int. Cl.
*C23C 16/455* (2006.01)
(52) U.S. Cl. .............. 427/248.1; 427/255.23; 700/123
(58) Field of Classification Search .............. 427/248.1, 427/255.23; 700/123
See application file for complete search history.

(56) References Cited

U.S. PATENT DOCUMENTS

| | | | |
|---|---|---|---|
| 5,108,983 A | 4/1992 | Lackey, Jr. et al. ............. 505/1 |
| 5,312,509 A | 5/1994 | Eschbach .................... 156/345 |
| 5,362,328 A * | 11/1994 | Gardiner et al. ............. 118/726 |
| 5,553,395 A | 9/1996 | Wen et al. ..................... 34/359 |
| 5,882,416 A * | 3/1999 | Van Buskirk et al. ....... 118/726 |
| 5,904,771 A | 5/1999 | Tasaki et al. ................ 117/105 |
| 6,303,809 B1 | 10/2001 | Chi et al. .................... 556/136 |
| 6,358,863 B1 * | 3/2002 | Desu et al. ................. 438/763 |
| 6,428,623 B2 | 8/2002 | Westmoreland et al. ...... 118/715 |
| 6,440,495 B1 | 8/2002 | Wade et al. .................. 427/250 |
| 6,605,735 B2 | 8/2003 | Kawano et al. ............. 556/136 |
| 6,660,328 B1 | 12/2003 | Dahmen et al. ........... 427/248.1 |
| 6,701,066 B2 | 3/2004 | Sandhu ....................... 392/386 |
| 6,713,373 B1 | 3/2004 | Omstead ..................... 438/608 |
| 6,718,126 B2 | 4/2004 | Lei ............................ 392/388 |
| 6,740,586 B1 | 5/2004 | Wang et al. ................. 438/680 |
| 2003/0129306 A1 | 7/2003 | Wade et al. |
| 2003/0145789 A1 | 8/2003 | Bauch et al. |
| 2004/0013577 A1 | 1/2004 | Ganguli et al. |
| 2004/0105934 A1 | 6/2004 | Chang et al. |
| 2004/0241321 A1 | 12/2004 | Ganguli et al. |
| 2005/0081882 A1 | 4/2005 | Greer et al. .................. 134/1.1 |
| 2005/0110142 A1 | 5/2005 | Lane et al. .................. 257/751 |
| 2005/0186341 A1 | 8/2005 | Hendrix et al. .......... 427/248.1 |

FOREIGN PATENT DOCUMENTS

| | | |
|---|---|---|
| EP | 0 714 999 | 6/1996 |
| WO | WO2004/010463 | 1/2004 |

* cited by examiner

*Primary Examiner*—Bret Chen
(74) *Attorney, Agent, or Firm*—Wood, Herron & Evans LLP

(57) ABSTRACT

A method for precursor delivery includes transferring a precursor vapor from a precursor vaporization system to an intermediate precursor chamber, collecting the precursor vapor in the intermediate precursor chamber, flowing a process gas containing the collected precursor vapor to a process chamber, and exposing a substrate in the process chamber to the process gas to deposit a layer including at least one element from the precursor vapor on the substrate.

22 Claims, 6 Drawing Sheets

US 7,485,338 B2

METHOD FOR PRECURSOR DELIVERY

FIELD OF THE INVENTION

The present invention relates to materials processing, and more particularly, to a method and system for delivering a precursor to a process chamber of a deposition system.

BACKGROUND OF THE INVENTION

Manufacturing of integrated circuits involves deposition of various materials onto substrates. These materials include metal and metal-containing layers that can, for example, include diffusion barriers/liners that prevent diffusion of copper conducting layers (Cu) into dielectric materials and promote adhesion and growth of the Cu layers. Chemical vapor deposition (CVD) has seen increasing use for preparation of layers and coatings in semiconductor wafer processing. CVD is a favored deposition method in many respects, for example, because of its ability to provide highly conformal and high quality layers at relatively fast processing times. Further, CVD is beneficial in coating substrates of irregular shapes including the provision of highly conformal layers even with respect to deep contacts and other openings. In general, CVD techniques involve the delivery of gaseous reactants (precursors) to the surface of a substrate where chemical reactions take place under temperature and pressure conditions that are favorable to the thermodynamics of the desired reaction. The type and composition of layers that can be formed using CVD is limited by the ability to deliver the reactants to the surface of the substrate.

In order for device manufacturing process to be practical, the deposition processes need to be carried out in a reasonable amount of time while achieving relatively constant substrate throughput. This requirement can necessitate efficient delivery of a precursor containing the metal element from a precursor container to a process chamber containing the substrate(s) to be processed. A common problem encountered in the deposition of materials by CVD techniques are low deposition rates due to low vapor pressures of the precursors and the transport issues associated therewith, thereby making the deposition processes impractical. A low vapor pressure can limit the flow of the precursor from a precursor container through gas lines to a process chamber of a deposition system where a substrate is exposed to the precursor to deposit a layer on the substrate.

The delivery of solid or liquid precursors in CVD processing can be carried out using the sublimator/bubbler method in which the precursor is usually placed in a sublimator/bubbler container which is then heated to the vaporization temperature of the precursor. The heated precursor is vaporized into a gaseous compound that is transported into the process chamber with a carrier gas. However, this procedure has been unsuccessful in reliably and reproducibly vaporizing a solid precursor and delivering the vaporized precursor to the process chamber for a number of reasons. The major problems with the technique are centered on the inability to consistently vaporize a solid precursor at a controlled rate such that a reproducible flow of vaporized precursor can be delivered to the process chamber. Also it is difficult to ensure complete saturation of the fast moving carrier gas stream because of limited amount of exposed surface area of the solid precursor in the vaporizer system and lack of uniform temperature to provide maximum vaporization. In addition, the temperature to which the solid or liquid precursor can be heated to provide adequate vapor pressure can be limited by premature decomposition of the precursor at that temperature.

For these and other reasons, it is desirable to provide apparatus and methods for consistently vaporizing a solid precursor at a controlled rate and delivering the vaporized precursor to a process chamber that overcome the various problems associated with conventional vaporization systems.

SUMMARY OF THE INVENTION

The present invention provides a method and system for delivering a precursor to a process chamber in a deposition system. Embodiments of the invention allow for enhanced delivery of a precursor having low vapor pressure and/or a thermally unstable precursor to deposit a layer onto a substrate in a process chamber.

Thus, the method includes transferring a precursor vapor from a precursor vaporization system to an intermediate precursor chamber, collecting the precursor vapor in the intermediate precursor chamber, flowing a process gas containing the collected precursor vapor to a process chamber, and exposing a substrate in the process chamber to the process gas to deposit a layer including at least one element from the precursor vapor on the substrate.

According to an embodiment of the invention, the precursor vapor can include a tantalum halide, a tantalum amide, a titanium halide, a titanium amide, a tantalum carbonyl, a tungsten halide, a tungsten carbonyl, a molybdenum carbonyl, a nickel carbonyl, a cobalt carbonyl, a rhodium carbonyl, a rhenium carbonyl, a chromium carbonyl, a ruthenium carbonyl, a osmium carbonyl, or a combination of two or more thereof. According to an embodiment of the invention, the deposited layer can contain Ta, Ti, W, Mo, Ni, Co, Rh, Re, Cr, Ru, or Os, or a combination of two or more thereof.

A deposition system is provided including a precursor vaporization system configured to produce a precursor vapor and an intermediate precursor chamber coupling the precursor vaporization system in fluid communication with a process chamber. The intermediate precursor chamber has an interior surface configured to collect the precursor vapor received from the precursor vaporization system and configured to release the precursor vapor for transfer to the process chamber. A controller is operatively coupled with the intermediate precursor chamber. The controller is configured to regulate the collection and release of the precursor vapor from the interior surface of the intermediate precursor chamber.

These and other advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

The invention provides a method and system for delivering a precursor in a deposition system. According to one embodiment of the invention, a method is provided for efficient delivery of a low vapor pressure and/or thermally sensitive precursor to a process chamber where a substrate is exposed to a process gas containing the precursor vapor to deposit a layer on the substrate. The precursor can, for example, be a metal-containing precursor such as a metal halide, a metal amide, a metal-carbonyl, or an organometallic precursor. In general, the precursor can originate as a solid phase, a liquid phase, or a gaseous phase.

In the following description, in order to facilitate a thorough understanding of the invention and for purposes of explanation and not limitation, specific details are set forth, such as a particular geometry of a deposition system and descriptions of various components of the deposition system. However, it should be understood that the invention may be practiced in other embodiments that depart from these specific details.

Figure 1:
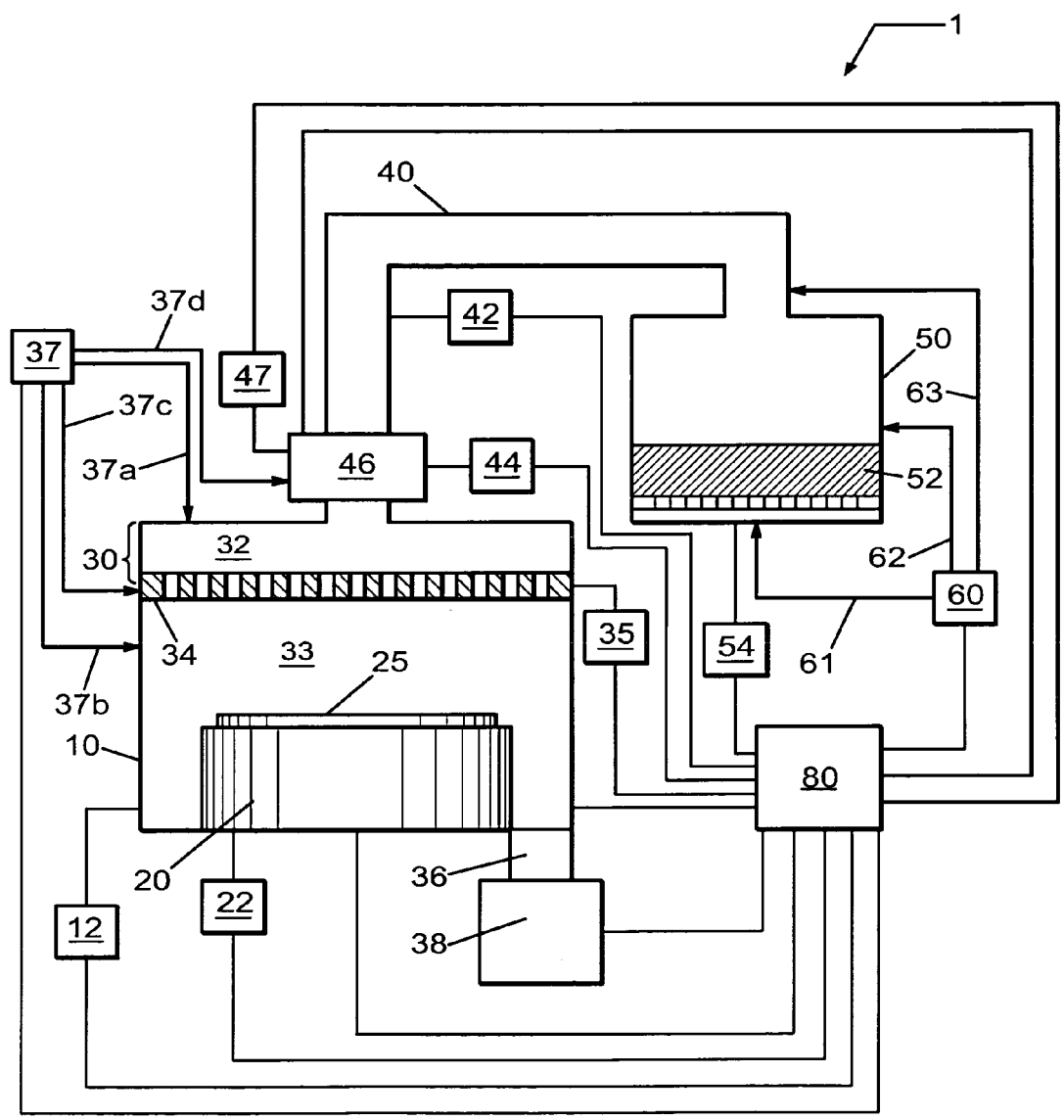
FIG. 1 depicts a schematic view of a deposition system according to an embodiment of the invention.

Referring now to the drawings, FIG. 1 depicts a deposition system for depositing a metal or a metal-containing layer on a substrate from decomposition of a precursor according to one embodiment of the invention. The deposition system 1 comprises a process chamber 10 having a substrate holder 20 configured to support a substrate 25, upon which the layer is formed. The process chamber 10 is coupled to a precursor vaporization system 50 via a vapor delivery system 40 and an intermediate precursor chamber 46.

The process chamber 10 is further coupled to a vacuum pumping system 38 through a duct 36, wherein the pumping system 38 is configured to evacuate the process chamber 10, the intermediate precursor chamber 46, the vapor delivery system 40, and the precursor vaporization system 50 to a pressure suitable for forming a layer on the substrate 25, and suitable for vaporization of the precursor 52 in the precursor vaporization system 50. Alternatively, the deposition system 1 can contain one or more additional pumping systems (not shown) to evacuate the above-mentioned components of the deposition system 1.

Still referring to FIG. 1, the precursor vaporization system 50 is configured to store a precursor 52, and heat the precursor 52 to a temperature sufficient for vaporizing the precursor 52 and introducing the precursor vapor to the vapor delivery system 40. The precursor 52 can be a solid under the selected heating conditions in the precursor vaporization system 50. Alternately, the precursor 52 can be a liquid. Below, the use of a solid precursor 52 is described, however, those skilled in the art will appreciate that precursors that are liquids under the selected heating conditions can be used without departing from the scope of the invention. In particular, precursor vaporization systems that include a liquid precursor source, a liquid mass flow controller, and a vaporizer, are well known in the art.

In order to achieve the desired temperature for vaporizing the precursor 52, the precursor vaporization system 50 is coupled to a vaporization temperature control system 54 configured to control the temperature of the precursor 52. In one example, the temperature of the precursor 52 can be elevated to between about 30° C. and about 150° C. As the precursor 52 is heated to vaporize the precursor 52, a first carrier gas can be passed over or through the precursor 52, or any combination thereof. Alternately, other embodiments contemplate omitting the first carrier gas. When a first carrier gas is used it can, for example, include an inert gas such as $N_2$ or a noble gas (i.e., He, Ne, Ar, Kr, or Xe), or CO, or a combination of two or more thereof.

For example, a gas supply system 60 is coupled to the precursor vaporization system 50, and it is configured to supply a first carrier gas beneath the precursor 52 via feed line 61, or over the precursor 52 via feed line 62. In addition, or in the alternative, the gas supply system 60 is coupled to the vapor delivery system 40 downstream from the precursor vaporization system 50 to supply the first carrier gas to the vapor of the precursor 52 via feed line 63 as or after it enters the vapor delivery system 40. Although not shown, the gas supply system 60 can comprise a first carrier gas source, one or more control valves, one or more filters, and a mass flow controller. For instance, the flow rate of the first carrier gas can be between about 0.1 standard cubic centimeters per minute (sccm) and about 1000 sccm. Alternately, the flow rates can be between about 10 sccm and about 500 sccm. Still alternately, the flow rates can be between about 50 sccm and about 200 sccm.

Downstream from the precursor vaporization system 50, the gas containing the precursor vapor flows through the vapor delivery system 40 until it enters the intermediate precursor chamber 46. The vapor delivery system 40 can be coupled to a vapor line temperature control system 42 in order to control the temperature of the vapor delivery system 40 and to prevent decomposition or condensation of the precursor vapor in the vapor delivery system 40.

Although not shown, when the precursor vapor is transferred to the intermediate precursor chamber 46, the intermediate precursor chamber 46 can be isolated from the process chamber 10 using a gate valve. During the transfer of the precursor, the precursor vapor can be collected in the intermediate precursor chamber 46. For example, the temperature of the intermediate precursor chamber 46 can be lowered to adsorb the vapor as a solid or liquid on the internal surfaces of the intermediate precursor chamber 46. The intermediate precursor chamber 46 is coupled to a temperature control system 44 in order to control the temperature of the intermediate precursor chamber 46. The temperature control system 44 can include a heater (e.g., a resistive heater), a fluid source, a heat exchanger, one or more temperature sensors for measuring the fluid temperature or the intermediate precursor chamber temperature, or both, and a controller configured to control the temperature of the intermediate precursor temperature, for example from about −30° C. to about 200° C.

The deposition system 1 further contains a vacuum pump 47 configured for evacuating the intermediate precursor chamber 46 prior to and/or during transfer of the precursor vapor to the intermediate precursor chamber 46. According to an embodiment of the invention, a first carrier gas used to aid in the transfer of the precursor vapor from the precursor vaporization system 50 to the intermediate precursor chamber 46, where the vapor is adsorbed on the internal surfaces of the intermediate precursor chamber 46, can be removed from the intermediate precursor chamber 46 using the vacuum pump 47.

According to an embodiment of the invention, a desired amount of the precursor 52 is transferred from the precursor vaporization system 52 and collected in the intermediated precursor chamber 46 before forming and flowing a process gas containing the precursor vapor to the process chamber 10.

When the desired amount of the precursor vapor has been collected, the process gas containing the precursor vapor is flowed to the process chamber 10. The desired amount can, for example, be an amount needed to deposit a layer with a desired thickness on a substrate. According to an embodiment of the invention, the process gas can be formed by flowing a second carrier gas from the gas source 37 through the intermediate precursor chamber 46 via feed line 37d. Like the first carrier gas, the second carrier gas can, for example, include an inert gas such as $N_2$ or a noble gas, or CO, or a combination of two or more thereof. According to an embodiment of the invention, the first and second carrier gases can be the same gas. Alternately, the first and second carrier gas maybe different gases.

Once in the intermediate precursor chamber 46, the second carrier gas can aid in the transfer of the precursor vapor to the process chamber 10. According to another embodiment of the invention, the second carrier gas can be omitted and the process gas consist only of the precursor vapor.

Referring again to FIG. 1, the vapor distribution system 30, which forms part of and is coupled to the process chamber 10, comprises a vapor distribution plenum 32 within which the process gas disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

According to an embodiment of the invention, the gas source 37 is coupled to the process chamber 10 and the gas source 37 can be configured to add a dilution gas, to the process gas containing the precursor vapor. Alternately, a dilution gas can be omitted. As shown in FIG. 1, the gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the gas source 37 can be coupled to the process chamber 10 via feed line 37b and configured to add the dilution gas to the process gas in the processing zone 33 above the substrate 25 after the process gas passes through the vapor distribution plate 34. Still alternately, the gas source 37 can be coupled to the vapor distribution system 30 via feed line 37c and configured to add the dilution gas to the process gas in the distribution plate 34. As will be appreciated by those skilled in the art, the dilution gas from the gas source 37 can be added to the process gas at other locations in the vapor distribution system 30 and the process chamber 10 without departing from the scope of the invention.

Once the process gas containing the precursor vapor enters the processing zone 33 of process chamber 10, the precursor vapor is exposed to the heated substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Still referring the FIG. 1, the deposition system 1 includes a control system 80 configured to operate and control the operation of the deposition system 1. The control system 80 is coupled to the process chamber 10, the substrate holder 20, the substrate temperature control system 22, the chamber temperature control system 12, the vapor distribution system 30, the gas source 37, the vapor delivery system 40, the vacuum pumping system 38, the temperature control system 44, the vapor line temperature control system 42, the precursor vaporization system 50, the distribution plate temperature control system 35, the vaporization temperature control system 54, the gas supply system 60, the vacuum pump 47, and the intermediate precursor chamber 46. The control system 80 is further coupled to gas valves (not shown) and mass flow controllers (not shown) that are well known to those skilled in the art.

Figure 2:
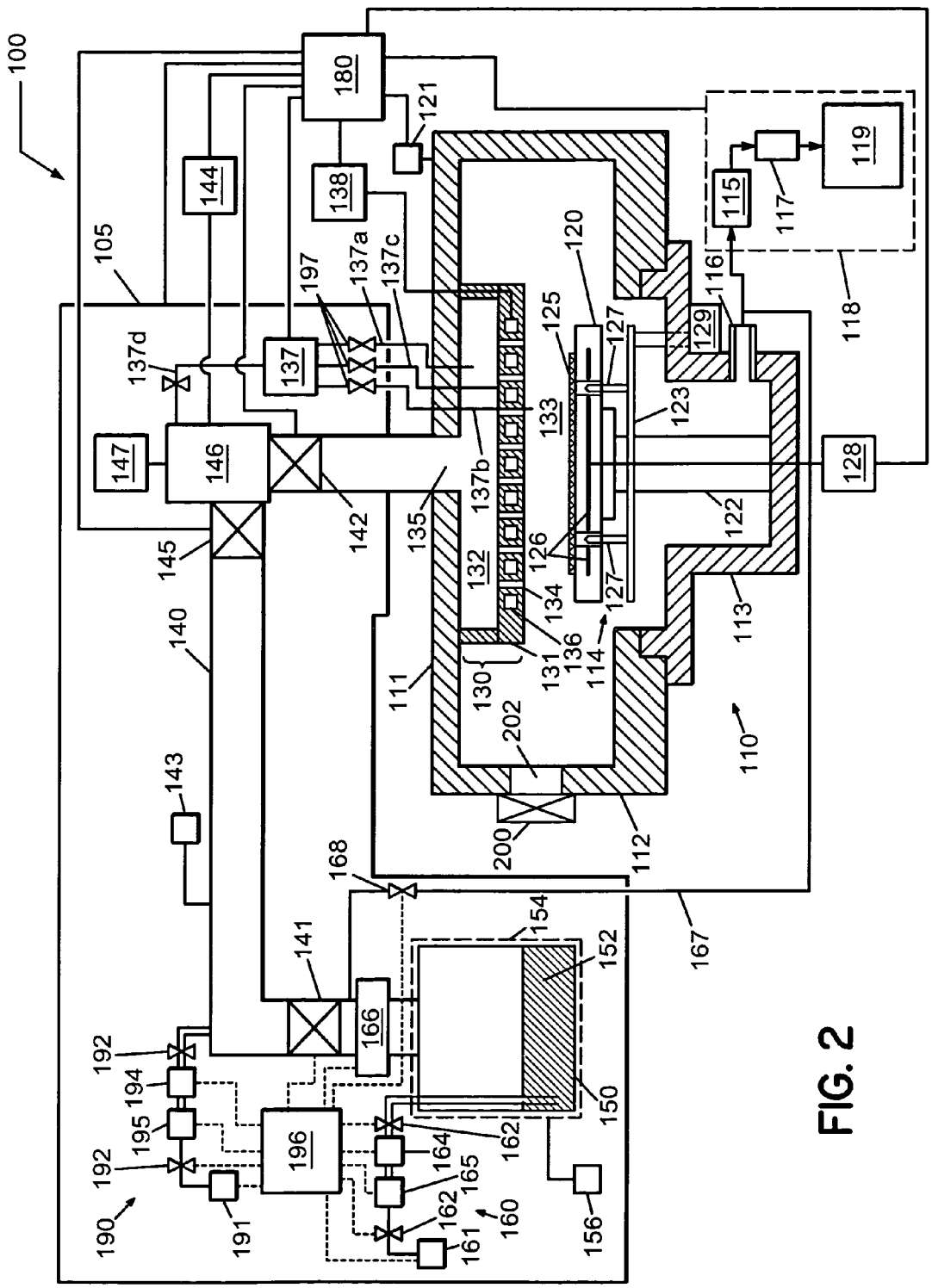
FIG. 2 depicts a schematic view of a deposition system according to another embodiment of the invention.

FIG. 2 depicts a schematic view of a deposition system 100 according to another embodiment of the invention. The deposition system 100 comprises a process chamber 110 having a substrate holder 120 configured to support a substrate 125, upon which a layer is formed. The process chamber 110 is coupled to a precursor delivery system 105 having precursor vaporization system 150 configured to store and vaporize a precursor vapor, and a vapor delivery system 140 configured to transport the precursor 152 to an intermediate precursor chamber 146.

Downstream from the precursor vaporization system 150, the gas containing the precursor vapor flows through the vapor delivery system 140 until it enters the intermediate precursor chamber 146. The vapor delivery system 140 can be coupled to a vapor line temperature control system 143 in order to control the temperature of the vapor delivery system 140 and to prevent decomposition or condensation of the precursor vapor.

When the precursor vapor is transferred to the intermediate precursor chamber 146, the intermediate precursor chamber 146 can be isolated from the process chamber 110 using gate valve 142, while the gate valve 145 remains open. During the transfer of the precursor, the precursor vapor can be collected in the intermediate precursor chamber 146. For example, the temperature of the intermediate precursor chamber 146 can be lowered to adsorb the precursor vapor as a solid or liquid on the internal surfaces of the intermediate precursor chamber 146. The intermediate precursor chamber 146 is coupled to a temperature control system 144 in order to control the temperature of the intermediate precursor chamber 146. The temperature control system 144 can include a heater, a fluid source, a heat exchanger, one or more temperature sensors for measuring the fluid temperature, the intermediate precursor chamber temperature, or both temperatures, and a controller configured to control the temperature of the intermediate precursor temperature, for example from about −30° C. to about 200° C. In one example, the intermediate precursor chamber 146 can be configured to have low thermal conductivity to facilitate fast cooling and heating of the intermediate precursor chamber 146 by the temperature control system 144, but this is not required for the invention.

The deposition system 100 further contains a vacuum pump 147 configured for evacuating the intermediate precursor chamber 146 before and/or during transfer of the precursor vapor to the intermediate precursor chamber 146. According to an embodiment of the invention, a first carrier gas used to aid in the transfer of the precursor vapor from the precursor vaporization system 150 to the intermediate precursor chamber 146, where the precursor vapor is adsorbed on the internal surfaces of the intermediate precursor chamber 146, can be removed from the intermediate precursor chamber 146 using the vacuum pump 147.

According to an embodiment of the invention, a desired amount of the precursor 152 is transferred from the precursor vaporization system 152 and collected in the intermediate precursor chamber 146 before forming and flowing a process gas containing the precursor vapor to the process chamber 110. When the desired amount of the precursor vapor has been collected in the intermediate precursor chamber 146, a process gas containing the precursor vapor is flowed to the process chamber 110. According to an embodiment of the invention, the process gas can be formed by flowing a second carrier gas from the gas source 137 to the intermediate precursor chamber 146 via feed line 137d. Once in the intermediate precursor chamber 146, the second carrier gas can aid in the transfer of the precursor vapor to the process chamber 110. According to another embodiment of the invention, the second carrier gas can be omitted and the process gas may consist only of the precursor vapor.

The process chamber 110 further comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature, the substrate holder temperature, or both temperatures, and a controller configured to perform at least one of monitoring, adjusting, or controlling the temperature of the substrate or substrate holder.

During processing, the heated substrate 125 is exposed to the process gas containing the precursor vapor to deposit a layer on the substrate 125. The substrate holder 120 is heated to a pre-determined temperature that is suitable for depositing the desired layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 100° C., or from about 40° C. to about 80° C. A pressure gauge (not shown) is used to measure the process chamber pressure.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

A gas source 137 is coupled to the process chamber 110 and is configured to add a dilution gas to the process gas, but this is not required for the invention. A dilution gas can be added to control the gas pressure in the process chamber 110. The dilution gas can be added to the process gas using feed lines 137a, 137b, and/or 137c, valves 197, one or more filters (not shown), and a mass flow controller (not shown). As shown in FIG. 2, the gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the gas source 137 can be configured to add the dilution gas to the process gas inside the vapor distribution plate 131 via feed line 137c. Alternately, the gas source 137 can be coupled to the process chamber 110 and configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention.

Furthermore, an opening 135 is provided in the upper chamber section 111 for introducing a precursor vapor from vapor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the precursor inside the vapor distribution system 130. For instance, a fluid, such as water, can be supplied to the fluid channels from a vapor distribution temperature control system 138. The vapor distribution temperature control system 138 can include a heater, a fluid source, a heat exchanger, one or more temperature sensors for measuring the fluid temperature or vapor distribution plate temperature or both, and a controller configured to control the temperature of the vapor distribution plate 131 from about 20° C. to about 150° C., for example.

As illustrated in FIG. 2, a precursor vaporization system 150 is configured to hold a precursor 152 and vaporize the precursor 152 by elevating the temperature of the precursor 152. A precursor heater 154 is provided for heating the precursor 152 to maintain the precursor 152 at a temperature that produces a desired precursor vapor pressure. The precursor heater 154 is coupled to a vaporization temperature control system 156 configured to control the temperature of the precursor 152. For example, the precursor heater 154 can be configured to adjust the temperature of the precursor 152 from about 40° C. to about 150° C. As the precursor 152 is heated to cause vaporization, a first carrier gas can be passed over or through the precursor 152, or any combination thereof. The first carrier gas can, for example, include an inert gas such as $N_2$ or a noble gas, or CO, or a combination of two or more thereof. Alternately, other embodiments contemplate omitting the first carrier gas. For example, a gas supply system 160 is coupled to the precursor vaporization system 150, and it is configured to, for instance, flow the first carrier gas over or through the precursor 152. Although not shown in FIG. 2, gas supply system 160 can also or alternatively be coupled to the vapor delivery system 140 to supply the first carrier gas to the vapor of the precursor 152 as or after it enters the vapor delivery system 140. The gas supply system 160 can comprise a gas source 161 containing a first carrier gas, one or more control valves 162, one or more filters 164, and a mass flow controller 165. For instance, the mass flow rate of first carrier gas can range from approximately 0.1 sccm to approximately 1000 sccm.

Additionally, a sensor 166 is provided for measuring the gas flow from the precursor vaporization system 150 to the intermediate precursor chamber 146. The sensor 166 can, for example, comprise a mass flow controller, and the total amount of precursor vapor delivered to the intermediate precursor chamber 146 can be determined using sensor 166 and mass flow controller 165. Alternately, the sensor 166 can comprise a light absorption sensor to measure the concentration of the precursor in the gas flow to the intermediate precursor chamber 146. The concentration can be integrated over time to determine the total amount of precursor vapor delivered to the intermediate precursor chamber 146.

In one embodiment of the invention, the total amount of precursor vapor transferred from the precursor vaporization system 150 to the intermediate precursor chamber 146 can be measured in-situ in the intermediate precursor chamber 146. For example, the cooling power supplied by the temperature control system 144 to maintain the intermediate precursor chamber 146 at a predetermined temperature during collection of the precursor vapor can be correlated with the total amount of precursor vapor transferred to the intermediate precursor chamber 146. In another embodiment of the invention, the total amount of precursor vapor transferred to the intermediate precursor chamber 146 can be correlated with the thickness of the deposited layer on the substrate 125, following exposure of the substrate to the process gas containing the precursor vapor.

A bypass line 167 can be located downstream from sensor 166, and it can connect the vapor delivery system 140 to an exhaust line 116. Bypass line 167 is provided for evacuating the vapor delivery system 140, and for stabilizing the supply of the precursor to the intermediate precursor chamber 146. In addition, a bypass valve 168, located downstream from the branching of the vapor delivery system 140, is provided on bypass line 167.

Referring still to FIG. 2, the vapor delivery system 140 comprises a high conductance vapor line having first and second valves 141 and 145, respectively. Additionally, the vapor delivery system 140 can further comprise a vapor line temperature control system 143 configured to heat the vapor delivery system 140 via heaters (not shown). The temperatures of the vapor lines can be controlled to avoid condensation of the precursor vapor in the vapor line. The temperature of the vapor lines can, for example, be controlled from about 20° C. to about 100° C. Moreover, a dilution gas can be supplied from a gas supply system 190, but this is not required for the invention. For example, the gas supply system 190 is coupled to the vapor delivery system 140, and it is configured to, for instance, mix the dilution gas with the precursor vapor in the vapor delivery system 140, for example, downstream of valve 141. The gas supply system 190 can comprise a dilution gas source 191, one or more control valves 192, one or more filters 194, and a mass flow controller 195. For instance, the mass flow rate of a dilution gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the first carrier gas and the precursor vapor. Sensor 166 is also connected to controller 195 and, based on output of the sensor 166, controller 195 can control the gas flow through mass flow controller 165 to obtain the desired precursor flow to the intermediate precursor chamber 146.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted precursor vapor and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, a controller 180 includes a microprocessor, a memory, and a digital I/O port capable of generating control voltages sufficient to communicate and activate inputs of the deposition system 100 as well as monitor outputs from the deposition system 100. Moreover, the controller 180 is coupled to and exchanges information with process chamber 110, precursor delivery system 105, which includes controller 196, vapor line temperature control system 143, intermediate precursor chamber 146, and vaporization temperature control system 156, vapor distribution temperature control system 138, vacuum pumping system 118, substrate temperature control system 128, the vacuum pump 147, and the intermediate precursor chamber 146. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

The controller 180 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

According to an embodiment of the invention, the deposition system 100 can contain a plurality of precursor vaporization systems 150 and a plurality of intermediate precursor chambers 146 to further increase the delivery of the metal-containing precursor vapor to the process chamber 110. In one example, the deposition system 100 can contain a single precursor vaporization system 150 and a plurality of intermediate precursor chambers 146. Alternately, the deposition system 100 can contain a plurality of precursor vaporization systems 150 and a single intermediate precursor chamber 146.

Figure 3:
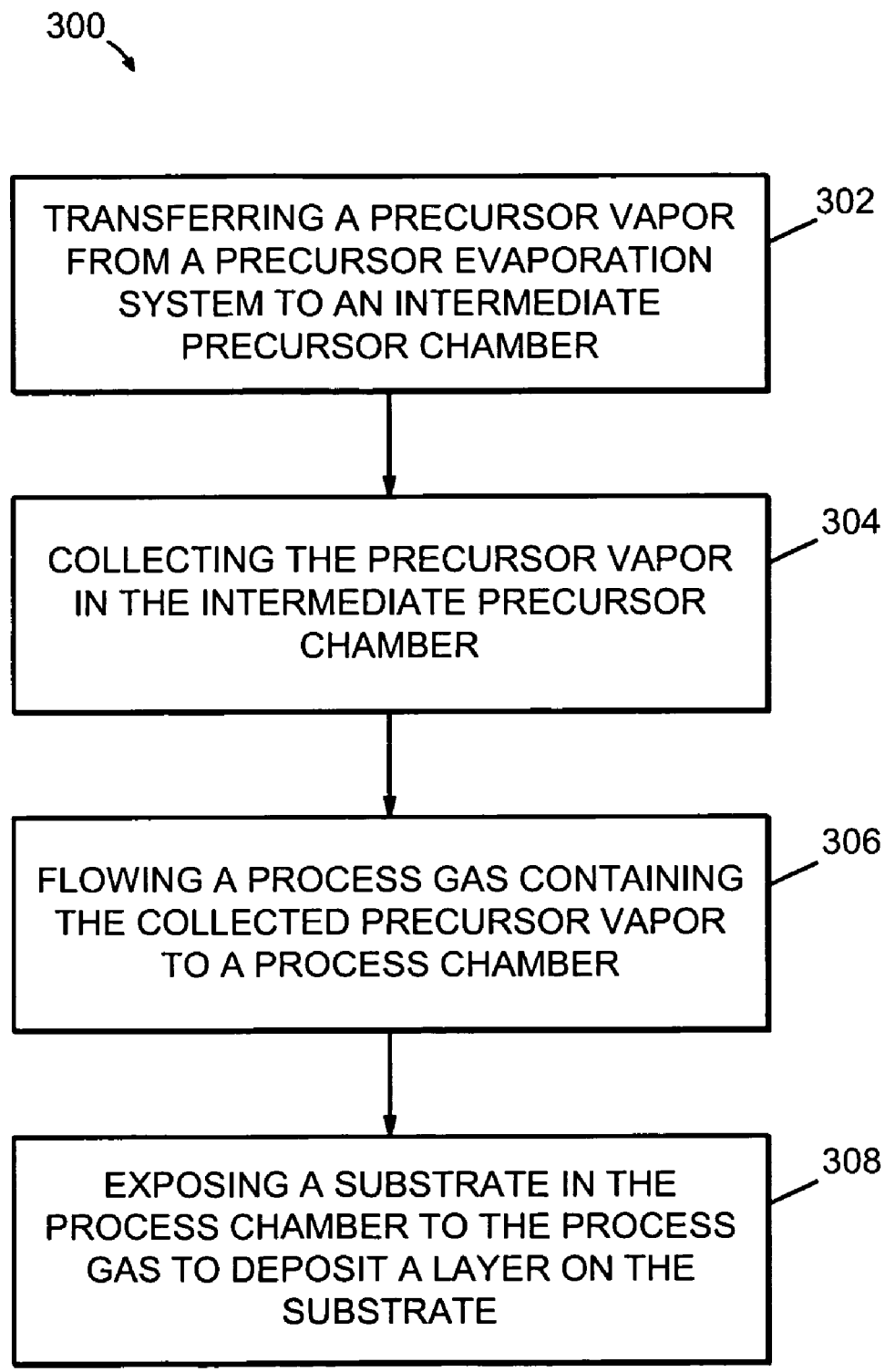
FIG. 3 is a flow chart illustrating a method of delivering a precursor in a deposition system according to an embodiment of the invention.

FIG. 3 illustrates a method of delivering a precursor in a deposition system according to an embodiment of the invention. For example, the deposition system can include the deposition systems described in FIGS. 1 and 2, although the method is not limited to those deposition systems, as other deposition systems may be used. The method 300 includes, in step 302, transferring a precursor vapor from a precursor vaporization system to an intermediate precursor chamber. The precursor vapor can be transferred to the intermediate precursor chamber by heating the precursor in the precursor vaporization system and flowing the precursor vapor to the intermediate precursor chamber. The vapor can be transferred to the intermediate precursor chamber using a first carrier gas, or alternatively, the first carrier gas can be omitted.

According to an embodiment of the invention, the precursor can be a tantalum-containing precursor such as, for example, a tantalum halide ($TaX_5$, where X is F, Cl, Br, or I), or a tantalum amide such as, for example, $Ta(N(C_2H_5CH_3))_5$ (PEMAT), $Ta(N(CH_3)_2)_5$ (PDMAT), $Ta(N(C_2H_5)_2)_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$. According to another embodiment of the invention, the precursor can be a titanium-containing precursor such as, for example a titanium halide ($TiX_4$, where X is F, Cl, Br, or I), or a titanium amide such as, for example $Ti(N(C_2H_5CH_3)_4$ (TEMAT), $Ti(N(CH_3)_4$ (TDMAT), or $Ti(C_2H_5)_2)_4$ (TDEAT). According to still another embodiment of the invention, the precursor can be a tungsten halide (e.g., $WF_6$).

According to yet another embodiment of the invention, the precursor can be an organometallic precursor such as, for example a ruthenium organometallic precursor such as (2,4-dimethylpentadienyl) (ethylcyclopentadienyl) ruthenium (Ru(DMPD)(EtCp)), bis(2,4-dimethylpentadienyl) ruthenium $(Ru(DMPD)_2)$, (2,4-dimethylpentadienyl)(methylcyclopentadienyl)ruthenium, or bis(ethylcyclopentadienyl)ruthenium $(Ru(EtCp)_2)$.

According to an embodiment of the invention, the precursor can be a metal carbonyl precursor. For instance, the metal carbonyl precursor can have the general formula $M_x(CO)_y$, and can comprise a tantalum carbonyl, a tungsten carbonyl, a nickel carbonyl, a molybdenum carbonyl, a cobalt carbonyl, a rhodium carbonyl, a rhenium carbonyl, a chromium carbonyl, a ruthenium carbonyl, an osmium carbonyl, or a combination of two or more thereof. These metal carbonyls include, but are not limited to, $Ta(CO)_5$, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

At step 304, the precursor vapor is collected in the intermediate precursor chamber. During the transfer of the precursor vapor to the intermediate precursor chamber, the intermediate precursor chamber can be isolated from the process chamber using a valve (e.g., valve 142 in FIG. 2), and the precursor vapor collected in the intermediate precursor chamber. According to one embodiment of the invention, the intermediate precursor chamber can be maintained at a temperature lower than that of the precursor vaporization system to adsorb the precursor vapor as a solid or liquid on the internal surfaces of the intermediate precursor chamber. As those skilled in the art will appreciate, the internal surfaces of the intermediate precursor chamber can have high surface areas to facilitate efficient adsorption of the vapor, but this not needed for the invention. In one example, the intermediate precursor chamber can be maintained at a temperature of about 50° C. to condense and collect a $Ru_3(CO)_{12}$ precursor vapor on the internal surfaces of the intermediate precursor chamber. As described above, if a first carrier gas is used to aid in the transfer of the precursor vapor from the precursor vaporization system to the intermediate precursor chamber, the first carrier gas can be removed from the intermediate precursor chamber using a vacuum pump. When the desired amount of precursor vapor has been collected in the intermediate precursor chamber, the intermediate precursor chamber is isolated from the precursor vaporization system using a valve (e.g., valve 145 in FIG. 2).

At step 306, a process gas containing the collected precursor vapor is flowed to the process chamber containing a substrate to be processed. According to one embodiment of the invention, the process gas can be formed by flowing a second carrier gas from a gas source through the intermediate precursor chamber. As the second carrier gas is flowed into the intermediate precursor chamber, the valve isolating the intermediate precursor chamber and the process chamber (e.g. valve 142 in FIG. 2) is opened. The second carrier gas can, for example, be flowed through the intermediate precursor chamber until the adsorbed precursor is fully vaporized and removed from the intermediate precursor chamber. Alternately, the second carrier gas can be omitted. According to one embodiment of the invention, the temperature of the intermediate precursor chamber can be raised by the temperature control system in order to vaporize the adsorbed precursor. In one example, the temperature of the intermediate precursor chamber can be raised from about 50° C. to about 150° C. to vaporize a $Ru_3(CO)_{12}$ precursor adsorbed on the internal surfaces of the intermediate precursor chamber.

At step 308, a substrate in the process chamber is exposed to the process gas containing the precursor vapor to deposit a layer on the substrate. The substrate can be uniformly exposed to the process gas utilizing a vapor distribution system. The substrate can, for example, be a Si substrate. A Si substrate can be of n- or p-type, depending on the type of device being formed. The substrate can be of any size, for example a 200 mm substrate, a 300 mm substrate, or an even larger substrate. The exposure of the substrate to the process gas forms a layer on the substrate in a deposition process. The deposition process can, for example, be a chemical vapor deposition (CVD) process or an atomic layer deposition (ALD) process. The substrate can be exposed to the process gas to form a layer with a desired thickness on the substrate. According to various embodiments of the invention, the layer may contain Ta, Ti, W, Mo, Ni, Co, Rh, Re, Cr, Ru, Os, or a combination of two or more thereof.

As would be appreciated by those skilled in the art, each of the steps or stages in the flowchart of FIG. 3 may encompass one or more separate steps and/or operations. Accordingly, the recitation of only three steps in 302, 304, 306, 308 should not be understood to limit the method of the present invention solely to three steps or stages. Moreover, each representative step or stage 302, 304, 306, 308 should not be understood to be limited to only a single process.

The use of an intermediate precursor chamber, as described in the several embodiments of the invention, can reduce or eliminate several problems encountered when delivering a precursor to a process chamber containing a substrate to be processed. Firstly, low vapor pressure and/or thermal instability of a precursor can severely limit the flow of the precursor vapor from the precursor vaporization system through gas lines to the process chamber, resulting in low deposition rates on a substrate in the process chamber. According to embodiments of the invention, precursor vapor is transferred to the intermediate precursor chamber, which is in fluid connection with the process chamber through a high-conductance gas line. This allows for subsequent rapid transfer of the precursor vapor from the intermediate precursor chamber to the process chamber, thereby enabling high deposition rates of a layer onto a substrate in the process chamber.

Secondly, embodiments of the invention allow for decoupling the gas pressure in the processing zone, during exposure of a substrate to a process gas, from the gas pressure in the precursor vaporization system. In other words, unlike in current deposition systems where the precursor vaporization system is in fluid communication with the processing zone during deposition, embodiments of the invention allow for selecting the gas pressure in the processing zone independently of the gas pressure in the precursor vaporization system. As described above, the precursor in the precursor vaporization system can be a solid phase, a liquid phase, or a gaseous phase.

Thirdly, a new substrate to be processed can be transferred into the process chamber while the precursor vapor is transferred to and collected in the intermediate precursor chamber, thereby increasing the substrate throughput. In other words, the "dead time" during transfer of the new substrate to the process chamber can be utilized to transfer the precursor vapor to the intermediate precursor chamber.

Figure 4A:
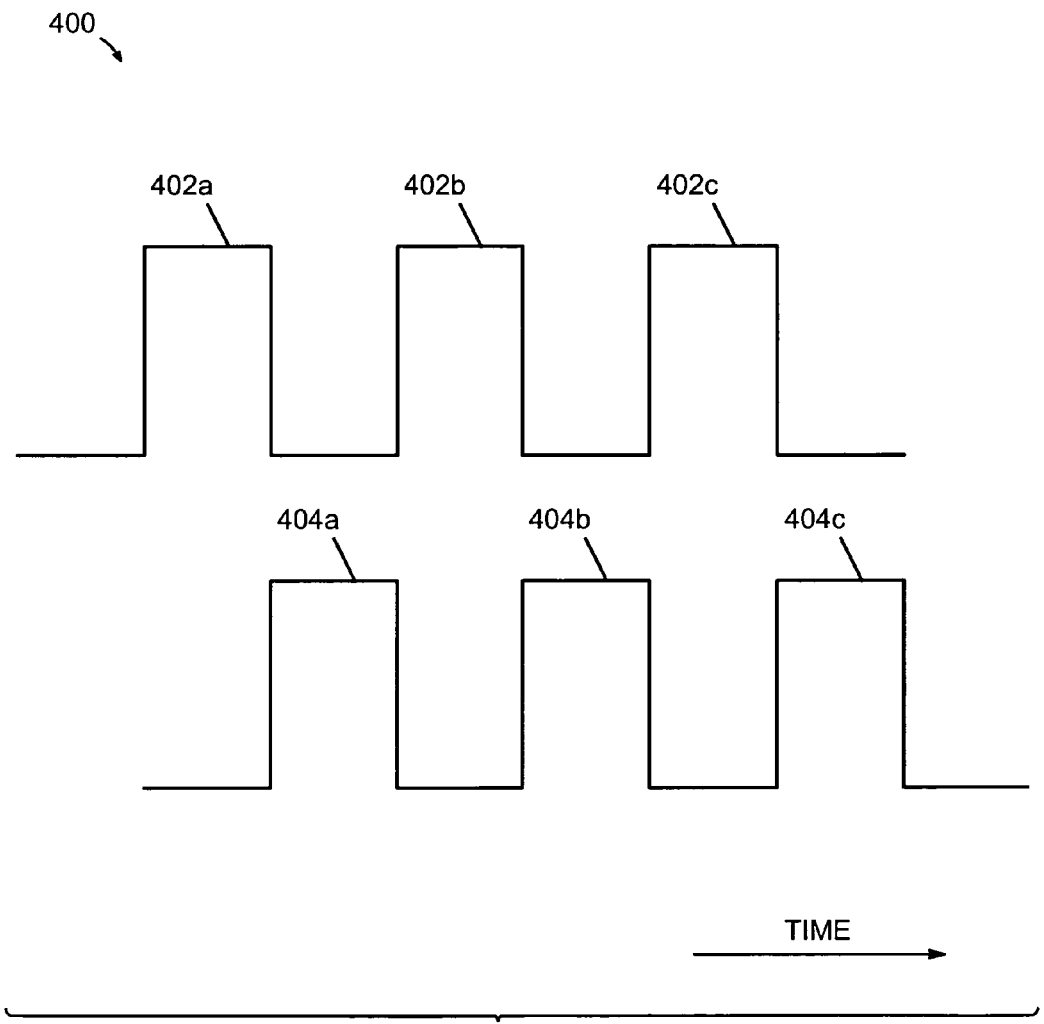
FIG. 4A is a schematic timing sequence for delivering a precursor in a deposition system according to an embodiment of the invention.

FIG. 4A is a schematic timing sequence for delivering a precursor in a deposition system according to an embodiment of the invention. The process 400 includes alternating sequences of transferring a precursor vapor from a precursor vaporization system to an intermediate precursor chamber (time periods 402a, 402b, etc) and flowing a process gas containing the precursor from the intermediate precursor chamber to a process chamber (time periods 404a, 404b, etc) where the substrate is exposed to the process gas. According to one embodiment of the invention, during time period 402a, the precursor can be transferred to the intermediate precursor chamber, and during time period 404a, a process gas containing the precursor vapor can be flowed to the process chamber 146 where the substrate exposed to the process gas. Next, the process can be repeated during time periods 402b and 404b with a new substrate in the process chamber. Alternately, the process can be repeated in steps 402b and 404b with the same substrate in the process chamber.

According to an embodiment of the invention, time period 402a can have the same length as time period 404a, but this is not required for the invention. Alternately, the time period 402a can have a different length than step 404a. According to another embodiment of the invention, the time periods 402a, 402b, 402c etc can have different lengths. Alternately, the time periods 402a, 402b, 402c etc can have the same lengths.

Figure 4B:
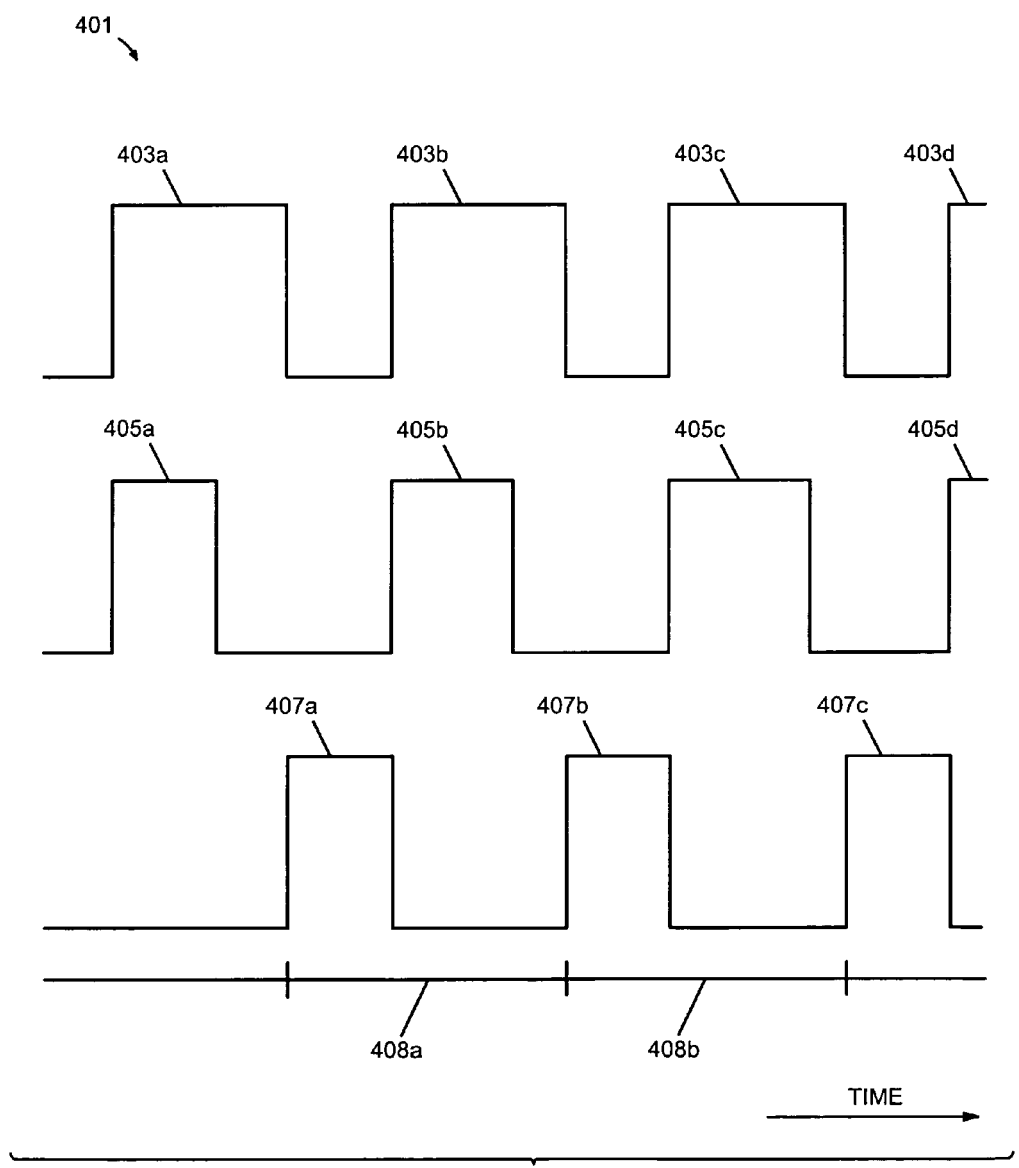
FIG. 4B is a schematic timing sequence for delivering a precursor in a deposition system according to another embodiment of the invention.

FIG. 4B is a schematic timing sequence for delivering a precursor in a deposition system according to another embodiment of the invention. The process 401 includes sequences of transferring a substrate in a process chamber (time periods 403a, 403b, 403c, etc.), transferring a precursor vapor from a precursor vaporization system to an intermediate precursor chamber (time periods 405a, 405b, 405c, etc.), and flowing a process gas containing the precursor vapor from the intermediate precursor chamber to a process chamber where a substrate is exposed to the process gas (time periods 407a, 407b, 407c, etc.). According to an embodiment of the invention, during time period 403a, a substrate can be transferred to the process chamber, during time period 405a, the precursor vapor can be transferred from the precursor vaporization system to the intermediate precursor chamber, and during time period 407a, the process gas containing the precursor vapor can be flowed to the process chamber where a substrate is exposed to the process gas. The process can be repeated during time periods 403b, 405b, and 407b with an new substrate in the process chamber. Alternately, the process can be repeated in steps 405b and 407b with the same substrate in the process chamber.

As schematically shown in FIG. 4B, the length of time periods 405a, 405b, 405c etc can be varied (e.g., 405a<405b<405c) while achieving constant substrate throughput (equal length of time periods 408a, 408b, etc.) required for high-volume manufacturing. In general, the inability to consistently vaporize a solid at a controlled rate to produce a reproducible flow of precursor vapor to the intermediate precursor chamber, can necessitate varying the length of time periods 405a, 405b, and 405c etc. to transfer a desired amount of precursor vapor to the intermediate precursor chamber while achieving a constant substrate throughput. Increased length of time periods 405a, 405b, and 405c, etc. can, for example, be required due to "aging" (premature decomposition) of the solid precursor in the precursor vaporization system, reduced amount of the solid precursor in the precursor vaporization system, and recrystallization of the solid precursor in the precursor vaporization system.

Figure 5:
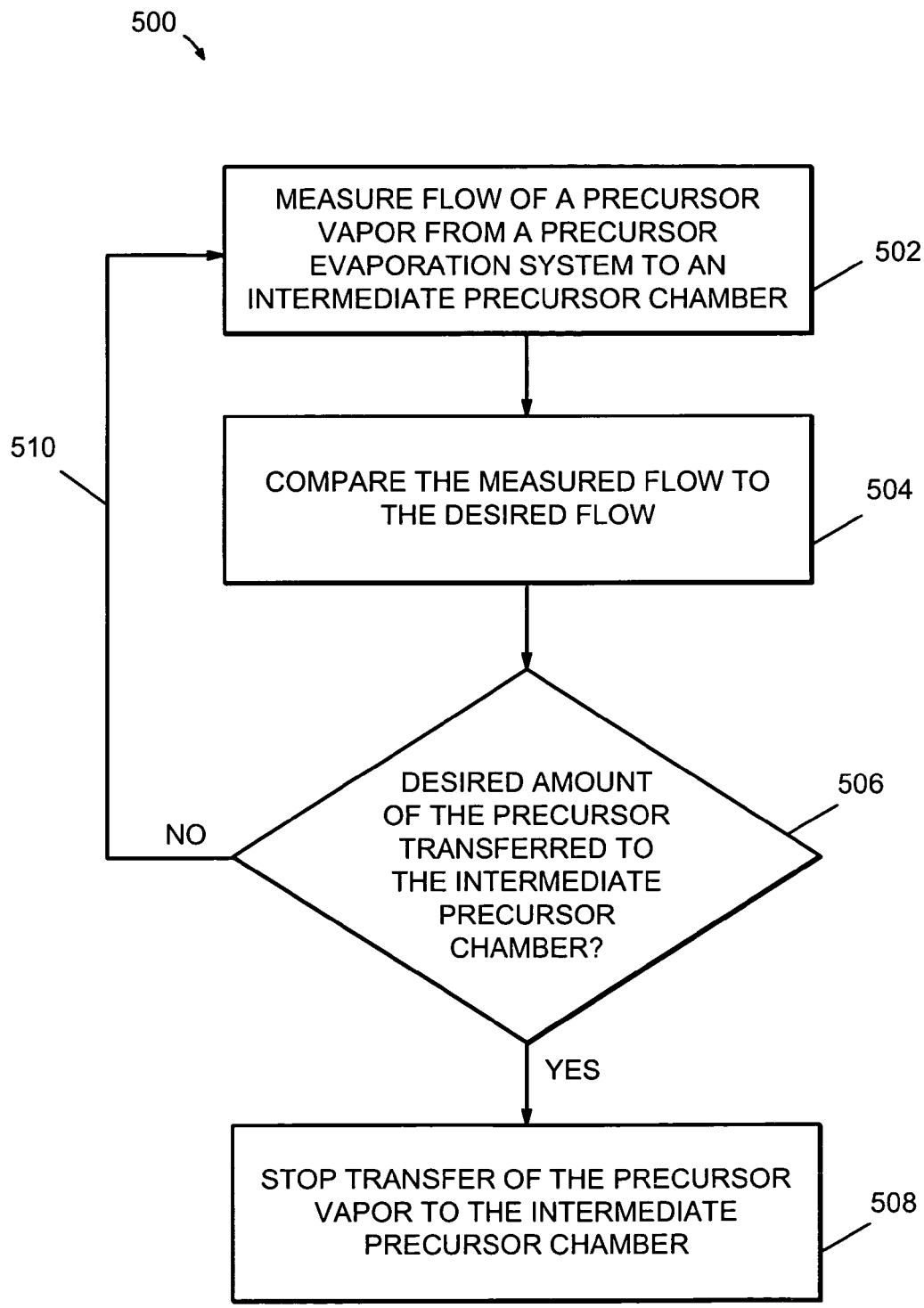
FIG. 5 is a flow chart illustrating a method of monitoring delivery of a precursor in a deposition system according to another embodiment of the invention.

FIG. 5 illustrates a method of monitoring delivery of a precursor in a deposition system according to an embodiment of the invention. The deposition system can, for example, be the deposition system 100 described in FIG. 2. The process 500 includes, in step 502, measuring flow of a precursor vapor from a precursor vaporization system to an intermediate precursor chamber. For example, as described in FIG. 2, the sensor 166 can be utilized for measuring the precursor vapor flow from the precursor vaporization system to the intermediate precursor chamber.

In step 504, the precursor vapor flow measured in step 502 is compared to the desired precursor vapor flow. The desired flow can, for example, be determined from deposition experiments where different amounts of precursor vapor is transferred to the intermediate precursor chamber, and subsequently flowed to the process chamber where a layer is deposited onto a substrate. If the desired flow has not been achieved, in step 506, a decision is made to continue flowing the precursor vapor to the intermediate precursor chamber and to continue measuring the flow in step 502, as shown by the process flow step 510 or, if the desired amount of precursor has been transferred to the intermediate precursor chamber, to stop the transfer of the precursor vapor, as shown by process flow step 508.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for precursor delivery in a deposition system, the method comprising:
   transferring a precursor vapor from a precursor vaporization system to an intermediate precursor chamber;
   isolating a process chamber from the intermediate precursor chamber;
   collecting the precursor vapor in the intermediate precursor chamber while the process chamber is isolated from the intermediate precursor chamber;
   releasing the collected precursor vapor from the intermediate precursor chamber;
   flowing a process gas containing the released precursor vapor to the process chamber;
   isolating the precursor vaporization chamber from the intermediate precursor chamber while flowing the process gas to the process chamber; and
   exposing a substrate in the process chamber to the process gas to deposit a layer including at least one element from the precursor vapor on the substrate.

2. The method according to claim 1, wherein transferring the precursor vapor further comprises:
   flowing a first carrier gas over or through a precursor in the precursor vaporization system.

3. The method according to claim 2, wherein collecting the precursor vapor further comprises:
   removing the first carrier gas from the intermediate precursor chamber by evacuating the intermediate precursor chamber.

4. The method according to claim 1, wherein transferring the precursor vapor further comprises:
   heating a precursor in the precursor vaporization system.

5. The method according to claim 1, wherein collecting the precursor vapor comprises:
   adsorbing the precursor vapor on an interior surface of the intermediate precursor chamber.

6. The method according to claim 1, wherein collecting the precursor vapor further comprises:
   maintaining the temperature of the intermediate precursor chamber below the temperature of the precursor vaporization system.

7. The method according to claim 5, wherein releasing the collected process gas further comprises:
   vaporizing the adsorbed precursor vapor collected in the intermediate precursor chamber to release the precursor vapor.

8. The method according to claim 7, wherein vaporizing the adsorbed precursor further comprises:
   heating the adsorbed precursor vapor collected in the intermediate precursor chamber.

9. The method according to claim 7, wherein flowing the process gas comprises:
   flowing a second carrier gas through the intermediate precursor chamber to transfer the released precursor vapor to process chamber.

10. The method according to claim 1, wherein the precursor vapor comprises a tantalum halide, a tantalum amide, a titanium halide, a titanium amide, a tantalum carbonyl, a tungsten halide, tungsten carbonyl, a molybdenum carbonyl, a nickel carbonyl, a cobalt carbonyl, a rhodium carbonyl, a rhenium carbonyl, a chromium carbonyl, a ruthenium carbonyl, an osmium carbonyl, an organometallic precursor, or a combination of two or more thereof.

11. The method according to claim 1, wherein the layer is deposited on the substrate in a chemical vapor deposition process or an atomic layer deposition process.

12. The method according to claim 11, wherein the at least one element comprises Ta, Ti, W, Mo, Ni, Co, Rh, Re, Cr, Ru, Os, or a combination of two or more thereof.

13. The method according to claim 1, wherein transferring the precursor vapor further comprises:
   measuring an amount of the precursor vapor transferred from the precursor vaporization system to the intermediate precursor chamber.

14. A method for precursor delivery in a deposition system, the method comprising:
   transferring a precursor vapor from a precursor vaporization system to an intermediate precursor chamber;
   maintaining the temperature of the intermediate precursor chamber below the temperature of the precursor vaporization system so that the precursor vapor is collected in the intermediate precursor chamber;
   elevating the temperature of the intermediate precursor chamber to release the collected precursor vapor from the intermediate precursor chamber;
   flowing a process gas containing the released precursor vapor to a process chamber; and
   exposing a substrate in the process chamber to the process gas to deposit a layer including at least one element from the precursor vapor on the substrate.

15. The method according to claim 14, wherein transferring the precursor vapor further comprises:

flowing a first carrier gas over or through a precursor in the precursor vaporization system.

16. The method according to claim 15, wherein collecting the precursor vapor further comprises:
removing the first carrier gas from the intermediate precursor chamber by evacuating the intermediate precursor chamber.

17. The method according to claim 14, wherein transferring the precursor vapor further comprises:
adsorbing the precursor vapor on an interior surface of the intermediate precursor chamber.

18. The method according to claim 14, wherein flowing the process gas comprises:
flowing a second carrier gas through the intermediate precursor chamber to transfer the released precursor vapor to process chamber.

19. The method according to claim 14, wherein the precursor vapor comprises a tantalum halide, a tantalum amide, a titanium halide, a titanium amide, a tantalum carbonyl, a tungsten halide, tungsten carbonyl, a molybdenum carbonyl, a nickel carbonyl, a cobalt carbonyl, a rhodium carbonyl, a rhenium carbonyl, a chromium carbonyl, a ruthenium carbonyl, an osmium carbonyl, an organometallic precursor, or a combination of two or more thereof.

20. The method according to claim 14, wherein the layer is deposited on the substrate in a chemical vapor deposition process or an atomic layer deposition process.

21. The method according to claim 20, wherein the at least one element comprises Ta, Ti, W, Mo, Ni, Co, Rh, Re, Cr, Ru, Os, or a combination of two or more thereof.

22. A computer readable medium containing program instructions for execution on a processor, which when executed by the processor, cause a deposition system to perform the steps in the method recited in claim 1.

* * * * *

UNITED STATES PATENT AND TRADEMARK OFFICE
CERTIFICATE OF CORRECTION

PATENT NO. : 7,485,338 B2
APPLICATION NO. : 11/095626
DATED : February 3, 2009
INVENTOR(S) : Jacques Faguet It is certified that error appears in the above-identified patent and that said Letters Patent is hereby corrected as shown below:

In column 2, line 30, before "osmium", insert --an--.

In column 14, line 57, change "an" to --a--.

Signed and Sealed this

Eighth Day of December, 2009

David J. Kappos
*Director of the United States Patent and Trademark Office*